(12) United States Patent  
Mizuno

(10) Patent No.: US 8,432,592 B2  
(45) Date of Patent: Apr. 30, 2013

(54) MICRO-STRUCTURE

(75) Inventor: Yoshihiro Mizuno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 630 days.

(21) Appl. No.: 12/688,919

(22) Filed: Jan. 18, 2010

(65) Prior Publication Data

US 2010/0245964 A1  Sep. 30, 2010

(30) Foreign Application Priority Data

Mar. 26, 2009  (JP) ................. 2009-075635

(51) Int. Cl.
  *G02B 26/08*  (2006.01)
(52) U.S. Cl.
  USPC ............. 359/199.2; 359/199.1; 359/224.1; 385/18
(58) Field of Classification Search .... 359/199.1–200.8, 359/221.2, 224.1–224.2; 310/309; 257/415–420  
See application file for complete search history.

(56) References Cited

U.S. PATENT DOCUMENTS 6,887,396 B2  5/2005  Tsuboi et al.  
7,476,590 B2 *  1/2009  Hayashi et al. ............... 438/285  
2008/0054758 A1 *  3/2008  Tsuboi et al. ................. 310/309

FOREIGN PATENT DOCUMENTS

JP   2002-328316 A   11/2002

* cited by examiner

*Primary Examiner* — James Phan  
(74) *Attorney, Agent, or Firm* — Fujitsu Patent Center

(57) ABSTRACT

A micro-structure produced by utilizing a MEMS technology or the like includes: a frame including a portion having a first layer and a portion having a second layer on the lower side of the first layer; a movable body including a portion having the first layer and a portion having the second layer; and at least one swing supporting portion which is having the first layer, and connects the portion having the first layer in the frame and the portion having the first layer in the movable body, to support the movable body to be capable of swinging. A frame side end portion of the swing supporting portion is supported from underneath by the portion having the second layer in the frame, and a movable body side end portion of the swing supporting portion is supported from underneath by the portion having the second layer in the movable body.

12 Claims, 16 Drawing Sheets

B-B CROSS SECTION

E-E CROSS SECTION

F-F CROSS SECTION

G-G CROSS SECTION

H-H CROSS SECTION

J-J CROSS SECTION

MICRO-STRUCTURE

CROSS-REFERENCE TO RELATED APPLICATION

This application is based upon and claims the benefit of priority of the prior Japanese Patent Application No. 2009-75635, filed on Mar. 26, 2009, the entire contents of which are incorporated herein by reference.

FIELD

The embodiment discussed herein is related to a micro-structure produced by utilizing a MEMS (Micro Electro Mechanical System) technology or the like, and in particular, to a micro-structure having a configuration of supporting a movable body to be capable of swinging.

BACKGROUND

A micro-structure produced by utilizing a MEMS technology includes a micro-mirror element, for example. The micro-mirror element is incorporated in an optical apparatus, such as an optical switch or the like, to swing a mirror surface thereof for reflecting a light, to thereby change a reflection direction (course) of the light. For example, there has been proposed an electrostatic-actuated type micro-mirror element which swings a mirror surface thereof utilizing an electrostatic force.

For example, an electrostatic actuated type micro-mirror element disclosed in Japanese Laid-open Patent Publication No. 2002-328316, includes: a frame; a mirror forming portion on which a mirror surface is formed; and a torsion bar connecting the frame and the mirror forming portion, the torsion bar can be formed to be thinner than the frame and the mirror forming portion, so that multiple design specifications of torsion bar can be obtained.

In the above-mentioned conventional technology, portions corresponding to the frame, the mirror forming portion and the torsion bar on a substrate are masked to be subjected to an etching process, and thereafter, the mask of the portion corresponding to the torsion bar is removed and the etching process is further performed, so that the torsion bar is formed to be thinner than the frame and the mirror forming portion. However, in the above-mentioned configuration, since end portions (base portions) of the torsion bar are positioned in the vicinity of inner surfaces of the frame and side faces of the mirror forming portion, namely, "walls", there is a possibility of shape instability of the end portions of the torsion bar, in particular, variations of size in a thickness direction thereof, depending on a mask shape, an etching recipe, a state of etching device or the like. Therefore, there is a possibility that torsional rigidity of the torsion bar, a resonance frequency of the mirror forming portion being a movable body, and further, characteristics of the micro-mirror element, are varied.

Incidentally, the above-mentioned problem, namely, the possibility of variations in the characteristics of the torsion bar due to the shape instability of the end portions thereof, is not limited to the micro-mirror element according to the above-described conventional technology, but is common to the micro-structures each of which has a configuration of supporting the movable body to be capable of swinging.

SUMMARY

According to one aspect of the present invention, a micro-structure includes: a frame including a portion having a first layer and a portion having a second layer on the lower side of the first layer; a movable body including a portion having the first layer and a portion having the second layer; and at least one swing supporting portion which is having the first layer, and connects the portion having the first layer in the frame and the portion having the first layer in the movable body, to support the movable body to be capable of swinging, in which a frame side end portion of the swing supporting portion is supported from underneath by at least the portion having the second layer in the frame, and a movable body side end portion of the swing supporting portion is supported from underneath by at least the portion having the second layer in the movable body.

According to another aspect of the present invention, a micro-structure includes: a first movable body including a portion having a first layer and a portion having a second layer on the lower side of the first layer; a second movable body including a portion having the first layer and a portion having the second layer, to surround the first movable body with a gap therebetween; a frame including a portion having the first layer and a portion having the second layer, to surround the second movable body with a gap therebetween; first swing supporting portions each of which has the first layer, and connects the portion having the first layer in the first movable body and the portion having the first layer in the second movable body, to support the first movable body to be capable of swinging; and second swing supporting portions each of which has the first layer, and connects the portion having the first layer in the second movable body and the portion having the first layer in the frame, to support the second movable body to be capable of swinging, in which a first movable body side end portion of each of the first swing supporting portions is supported from underneath by at least the portion having the second layer in the first movable body, and also, a second movable body side end portion of each of the first swing supporting portions is supported from underneath by at least the portion having the second layer in the second movable body, and further, a second movable body side end portion of each of the second swing supporting portions is supported from underneath by at least the portion having the second layer in the second movable body, and also, a frame side end portion of each of the second swing supporting portions is supported from underneath by at least the portion having the second layer in the frame.

According to a further aspect of the present invention, an optical switch reflects a light input to an input port by micro-mirror element of which an angle of a mirror surface is controllable, to output the reflected light from desired output port, in which the micro-mirror element includes: a frame including a portion having a first layer and a portion having a second layer on the lower side of the first layer; a movable body including a portion having the first layer and a portion having the second layer, on which the mirror surface is formed; and at least one swing supporting portion which has the first layer, and connects the portion having the first layer in the frame and the portion having the first layer in the movable body, to support the movable body to be capable of swinging, and a frame side end portion of the swing supporting portion is supported from underneath by at least the portion having the second layer in the frame, and a movable body side end portion of the swing supporting portion is supported from underneath by at least the portion having the second layer in the movable body.

The object and advantages of the invention will be realized and attained by means of the elements and combinations particularly pointed out in the claims.

It is to be understood that both the foregoing general description and the following detailed description are exemplary and explanatory only and are not restrictive of the invention, as claimed.

DESCRIPTION OF EMBODIMENTS

Hereinafter, embodiments of the present invention will be explained with reference to accompanying drawings.

Figure 1:
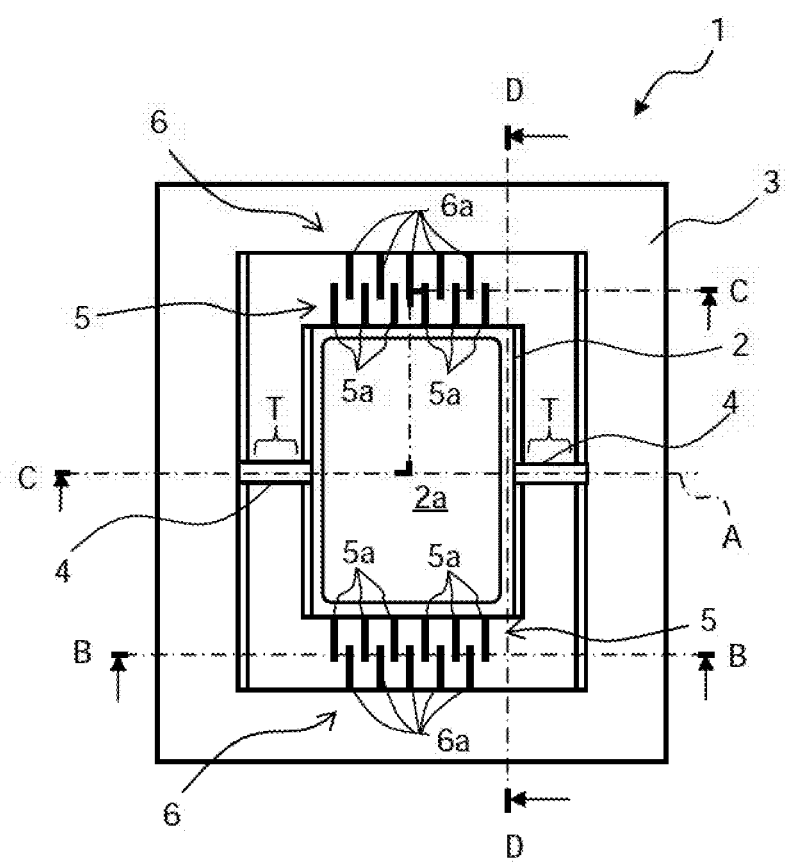
FIG. 1 is a top view illustrating a micro-mirror element according to a first embodiment of the present invention.
Figure 2:
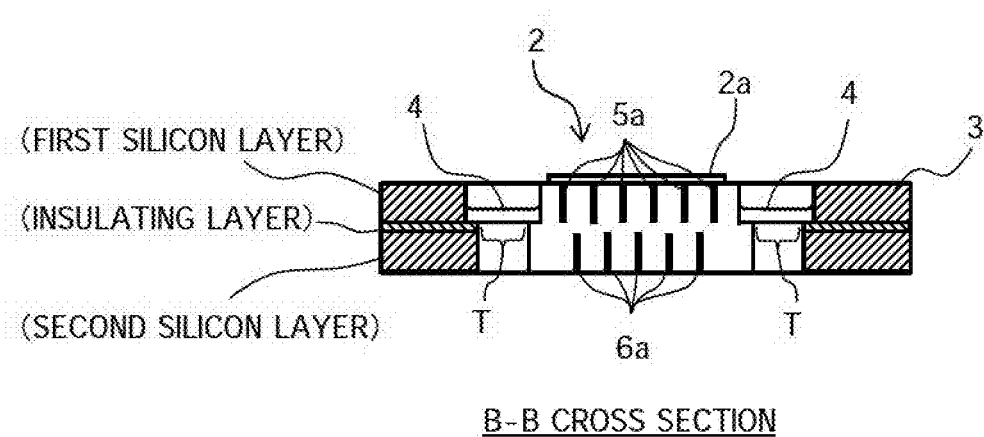
FIG. 2 is a cross sectional view taken along the line B-B of FIG. 1.

FIG. 1 and FIG. 2 illustrate a micro-mirror element as a micro-structure according to a first embodiment of the present invention. FIG. 1 is a top view of the micro-mirror element according to the present embodiment and FIG. 2 is a cross sectional view taken along the line B-B of FIG. 1.

The micro-mirror element according to the present embodiment is produced by processing a SOI (Silicon On Insulator) substrate (material substrate) by utilizing, for example, a bulk micro-machining technology which is one of MEMS technologies. Herein, the SOI substrate being the material substrate has a multilayer structure in which an insulating layer, such as silicon oxide, is positioned between a first silicon layer and a second silicon layer. Further, the first silicon layer and the second silicon layer are doped with impurities to be given with conductivity.

As illustrated in FIG. 1, the micro-mirror element 1 according to the first embodiment includes a movable body 2, a frame 3, and a pair of swing supporting portions 4.

The movable body 2 has a multilayer structure having the first silicon layer, the insulating layer and the second silicon layer, and is formed in, for example, a rectangular shape to be disposed inside of the frame 3. On a surface of the movable body 2, a mirror surface 2a for reflecting a light is formed. The mirror surface 2a is, for example, a metallic thin film, such as a Cr/Au film or the like, of a two-layer structure, which is formed on the first silicon layer. Further, on two opposing side faces of the movable body 2, namely, on two side faces opposite to each other in a vertical direction in FIG. 1, first comb-shaped electrodes 5 are formed to extend from the side faces of the movable body 2. Each of the first comb-shaped electrodes 5 has the first silicon layer, and includes a plurality of electrode teeth 5a spaced from each other.

The frame 3 has a multilayer structure having the first silicon layer, the insulating layer, and the second silicon layer, similarly to the movable body 2, and is formed in a rectangular frame shape to surround the movable body 2 with a predetermined gap. On inner surfaces of the frame 3 opposite to the side faces of the movable body 2 on which the first comb-shaped electrodes 5 are formed, second comb-shaped electrodes 6 are formed to extend from the inner surfaces of the frame 3. Each of the second comb-shaped electrodes 6 which is for cooperating with each of the first comb-shaped electrodes 5 to generate an electrostatic force (electrostatic attraction), is having the second silicon layer, and includes a plurality of electrode teeth 6a spaced from each other. Herein, as illustrated in FIG. 2, the respective electrode teeth 6a of each of the second comb-shaped electrodes 6 are formed below the respective electrode teeth 5a of each of the first comb-shaped electrodes 5. Further, as illustrated in FIG. 1, each electrode tooth 6a of each of the second comb-shaped electrodes 6 is positioned between two electrode teeth 5a adjacent to each other in each of the first comb-shaped electrodes 5 as viewed from above (or in an arrangement direction of the electrode teeth).

The respective swing supporting portions 4 connect the frame 3 and the movable body 2, to support the movable body 2 to be capable of swinging. Namely, the respective swing supporting portions 4 connect side faces of the movable body 2, on which the first comb-shaped electrodes 5 are not formed, and inner surfaces of the frame 3, on which the second comb-shaped electrodes 6 are not formed, to support the movable body 2 to be capable of swinging. Then, a swing center axis A of swinging operation of the movable body 2 is defined by the pair of swing supporting portions 4.

In the present embodiment, each swing supporting portion 4 has the first silicon layer, and connects a portion having the first silicon layer in the movable body 2 and a portion having the first silicon layer in the frame 3. Further, each swing supporting portion 4 is formed to be thinner than the portion having the first silicon layer in the movable body 2 and the portion having the first silicon layer in the frame 3.

As illustrated in FIG. 2, a frame 3 side end portion of each swing supporting portion 4 is supported, via the insulating layer, from underneath by a portion having the second silicon layer in the frame 3. In other words, the frame 3 side end portion of each swing supporting portion 4 is formed on an upper surface of a portion having the insulating layer and the second silicon layer, which protrudes toward the movable body 2 side compared to the portion having the first silicon layer in the frame 3.

Further, a movable body 2 side end portion of each swing supporting portion 4 is supported, via the insulating layer, from underneath by a portion having the second silicon layer in the movable body 2. In other words, the movable body 2 side end portion of each swing supporting portion 4 is formed on an upper surface of a portion having the insulating layer and the second silicon layer, which protrudes toward the frame 3 side compared to the portion having the first silicon layer in the movable body 2.

Namely, each swing supporting portion 4 having the first silicon layer has a structure in which both end portions thereof are supported from underneath by the portion having the second silicon layer in the movable body 2 and the portion having the second silicon layer in the frame 3. According to this structure, in the present embodiment, in the respective swing supporting portions 4, a region (portion) which is not supported from underneath by the portion having the second silicon layer in the movable body 2 and the portion having the second silicon layer in the frame 3, that is, T-portion in FIG. 2, substantially functions as "a torsion bar".

FIG. 3 illustrates one example of producing method of the micro-mirror element 1 according to the present embodiment. Here, FIG. 3 illustrates a portion corresponding to a cross section taken along the line C-C of FIG. 1.

Figure 3A:
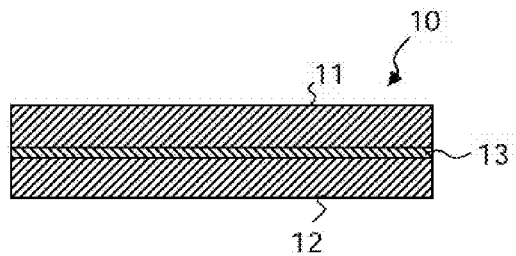
FIG. 3 is a view illustrating one example of producing method of the micro-mirror element according to the first embodiment.

Firstly, a material substrate 10 as illustrated in FIG. 3A is prepared. The material substrate 10 is a SOI substrate having a multilayer structure having a first silicon layer 11 and a second silicon layer 12 which are given with conductivity, and an insulating layer 13 positioned between the first silicon layer 11 and the second silicon layer 12.

Figure 3B:
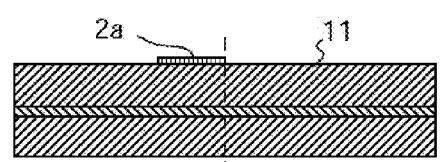

Next, as illustrated in FIG. 3B, a mirror surface 2a is formed on the first silicon layer 11. The mirror surface 2a is formed by performing Cr film deposition on the first silicon layer 11 and subsequently performing Au film deposition thereon, by utilizing a spattering method for example. Then, an etching process is sequentially performed on these metal thin films via a predetermined mask, so that the mirror surface 2a is patterned.

Figure 3C:
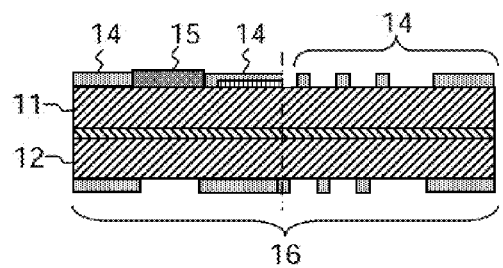

Next, as illustrated in FIG. 3C, an oxide film pattern 14 and a resist pattern 15 are formed on the first silicon layer 11, and an oxide film pattern 16 is formed on the second silicon layer 12. The oxide film pattern 14 has a pattern shape corresponding to the movable body 2, the frame 3 and the first comb-shaped electrodes 5, and the resist pattern 15 has a pattern shape corresponding to the swing supporting portions 4. Further, the oxide film pattern 16 has a pattern shape corresponding to the movable body 2, the frame 3 and the second comb-shaped electrodes 6. Here, a portion corresponding to the movable body 2 and the frame 3, in the oxide film pattern 16 formed on the second silicon layer 12, is slightly larger than a portion corresponding to the movable body 2 and the frame 3, in the oxide film 14 formed on the first silicon layer 11.

Figure 3D:
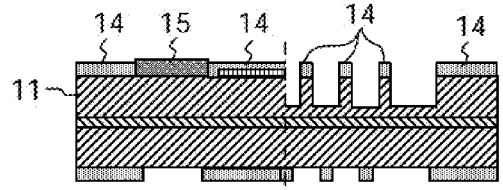

Next, as illustrated in FIG. 3D, the oxide film pattern 14 and the resist pattern 15 are used as masks, and the first silicon layer 11 is subjected to the etching process by DRIE (Deep Reactive Ion Etching) to the predetermined depth. The predetermined depth is corresponding to the thickness of each swing supporting portion 4, and can be arbitrarily set.

Figure 3E:
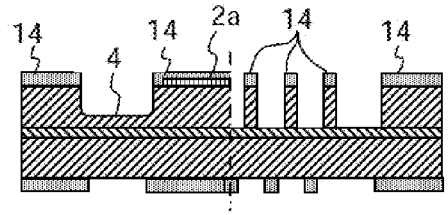

Next, as illustrated in FIG. 3E, the resist pattern 15 is released with releasing liquid, and thereafter, the oxide film pattern 14 is used as a mask, and the first silicon layer 11 is subjected to the etching process by DRIE to the insulating layer 13, to thereby form (leave) each swing supporting portion 4. By such two-staged DRIE, the thickness of each swing supporting portion 4 can be different from the thickness of the portion having the first silicon layer in the movable body 2 and/or in the frame 3, so that torsional rigidity or the like of each swing supporting portion 4 (and namely, the torsion bar) can be regulated.

By performing the processes illustrated in FIG. 3A to FIG. 3E, portions formed of the first silicon layer in the micro-mirror element 1, that is, a part of the movable body 2 (inclusive of the mirror surface 2a), a part of the frame 3, the swing supporting portions 4 and the first comb-shaped electrodes 5, are formed.

Figure 3F:
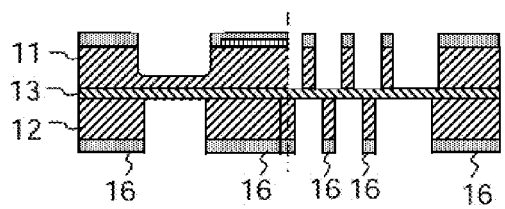

Next, as illustrated in FIG. 3F, the oxide film pattern 16 is used as a mask, and the second silicon layer 12 is subjected to the etching process by DRIE to the insulating layer 13. By performing this etching process, portions formed of the second silicon layer in the micro-mirror element 1, that is, a part of the movable body 2, a part of the frame 3 and the second comb-shaped electrodes 6, are formed.

Figure 3G:
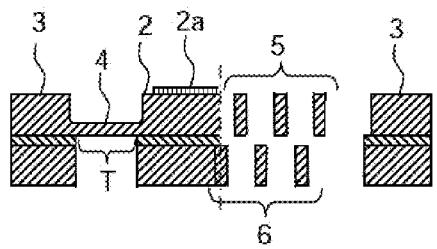

Next, as illustrated in FIG. 3G, an exposed portion of the insulating layer 13, the oxide film pattern 14 and the oxide film pattern 16 are removed by dry etching or wet etching.

A series of processes illustrated in FIG. 3A to FIG. 3G described above is performed, so that the movable body 2, the frame 3, the swing supporting portions 4, the mirror surface 2a, the first comb-shaped electrodes 5 and the second comb-shaped electrodes 6 are formed, and consequently, the micro-mirror element 1 is produced.

FIG. 4 is a view explaining an operation of the micro-mirror element 1 and is corresponding to a cross section taken along the line D-D of FIG. 1.

Figure 4A:
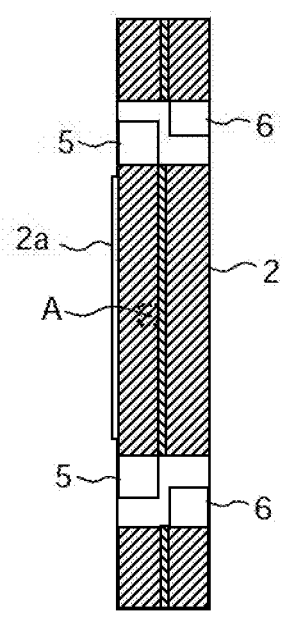
FIG. 4 is a view explaining an operation of the micro-mirror element according to the first embodiment.
Figure 4B:
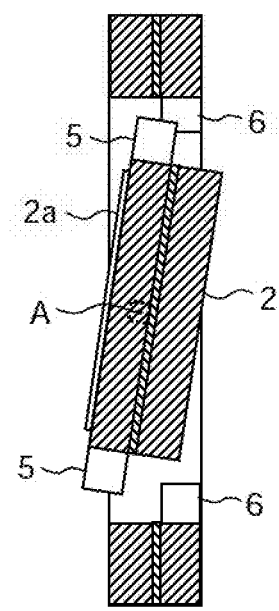

As illustrated in FIG. 4A, in the micro-mirror element 1, when the movable body 2 is not operated, each of the first comb-shaped electrodes 5 and each of the second comb-shaped electrodes 6 are positioned at heights different from each other. In this state, when a predetermined voltage is applied between one of the first comb-shaped electrodes 5 and one of the second comb-shaped electrodes 6 (here, upper side in FIG. 4), the electrostatic attraction is generated between the first comb-shaped electrode 5 and the second comb-shaped electrode 6 which have been applied with the voltage, so that the first comb-shaped electrode 5 is attracted to the second comb-shaped electrode 6, as illustrated in FIG. 4B. As a result, the movable body 2 swings around the swing center axis A to be rotationally displaced to an angle at which the generated electrostatic attraction is commensurate with the sum of torsional resistance forces of the respective swing supporting portions 4 (to be more specific, the T-portions functioning as the torsion bar). Here, by regulating the voltage to be applied between the first comb-shaped electrode 5 and the second comb-shaped electrode 6, the rotational displacement angle of the movable body 2 can be regulated, and thus, an angle of the mirror surface 2a is controlled. Further, when the predetermined voltage is applied between the other comb-shaped electrode 5 and the other comb-shaped electrode 6 (lower side in FIG. 4), in place of the one of the comb-shaped electrode 5 and the one of the comb-shaped electrode 6, the movable body 2 swings in a direction opposite to that in FIG. 4B. Then, when the application of the voltage between the first comb-shaped electrode 5 and the second comb-shaped electrode 6 is stopped to thereby extinguish the electrostatic attraction generated between the first comb-shaped electrode 5 and the second comb-shaped electrode 6, the micro-mirror element 1 returns to the state in FIG. 4A. Incidentally, in the present embodiment, the first silicon layer is corresponding to "a first layer" in the invention, and the second silicon layer is corresponding to "a second layer" in the invention.

In the micro-mirror element 1 according to the present embodiment, the movable body 2 side end portion of each swing supporting portion 4 is supported from underneath by the portion having the second silicon layer in the movable body 2, and the frame 3 side end portion of each swing supporting portion 4 is supported from underneath by the portion having the second silicon layer in the frame 3. Therefore, in the swing supporting portions 4, the portions (T-portions) which are not supported from underneath by the portions having the second silicon layer, substantially function as the torsion bar. Namely, in the swing supporting portions 4, the portions spaced from the side faces of the movable body 2 and the inner surfaces of the frame 3 which are "walls", that is, the portions stably formed in the swing supporting portions 4 can serve as the torsion bar.

Figure 5:
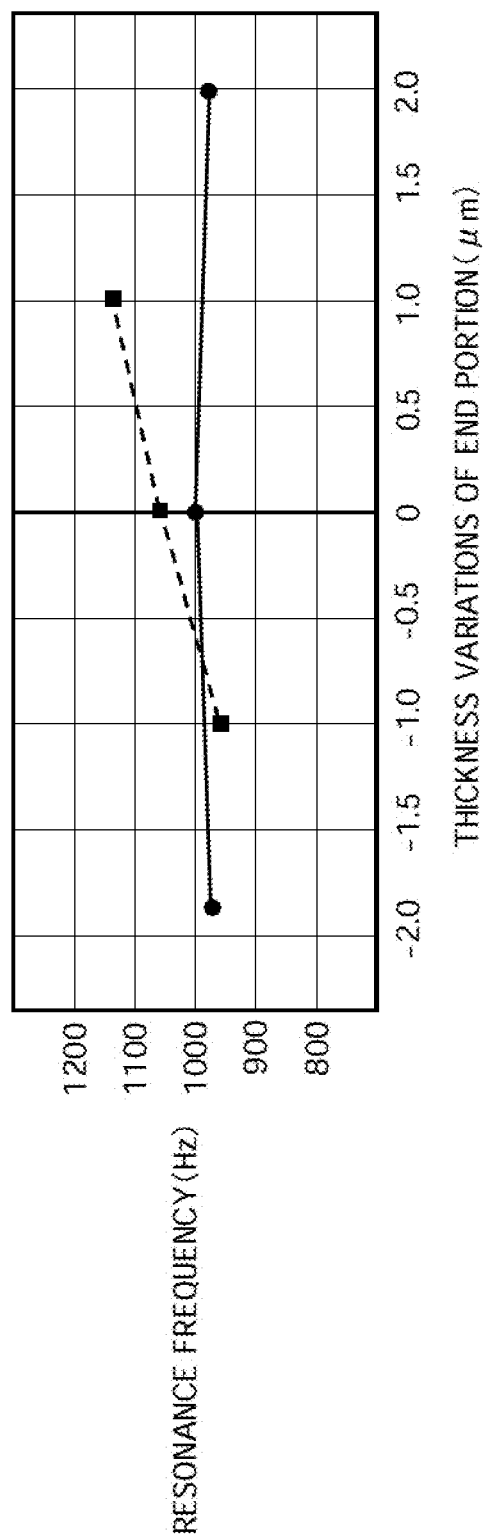
FIG. 5 is a graph illustrating a simulation result of resonance frequency of a movable body.

FIG. 5 illustrates one example of simulation result of resonance frequency of the movable body 2. Herein, the case where the standard thickness of the swing supporting portion 4 is, for example, 3.5 (μm), is indicated.

If the configuration is such that both end portions of each swing supporting portion 4 are not supported from underneath as in a conventional technology, the entirety of the swing supporting portions 4 functions as the torsion bar. In this case, as illustrated by a broken line in FIG. 5, the thickness of the end portions of each swing supporting portion 4 is varied, so that the resonance frequency of the micro-mirror element 1 (movable body 2) is largely changed due to an influence of such variations. Contrary to the above, in the structure of the micro-mirror element 1 according to the present embodiment, as illustrated by a solid line in FIG. 5, even if the thickness of the end portions of each swing supporting portion 4 is varied, such variations less affect the portions functioning as the torsion bar, and therefore, the resonance frequency of the movable body 2 is not practically changed.

Thus, if the micro-mirror element has the structure according to the present embodiment, the resonance frequency of the movable body 2, which affects characteristics of the micro-mirror element 1, is not practically affected by the thickness variations of the end portions of each swing supporting portion 4. As a result, deviation in the resonance frequency of the movable body 2 due to the shape instability of the end portions of each swing supporting portion 4 can be suppressed while enabling each swing supporting portion 4 to be thinner and obtaining multiple design specifications of the torsion bar, so that characteristic variations in the micro-mirror element 1 can be suppressed.

Here, in the above-mentioned embodiment, each swing supporting portion 4 having the first silicon layer is formed to be thinner than the portion having the first silicon layer in the movable body 2 and the portion having the first silicon layer in the frame 3. However, each swing supporting portion 4 may be formed to be in the same thickness as those of the portion having the first silicon layer in the movable body 2 and the portion having the first silicon layer in the frame 3. The end portions of each swing supporting portion 4 may be varied not only in the thickness thereof as described above but also in the width thereof or the connecting shape (for example, a corner R-shape) to the movable body 2 or the frame 3. However, by forming each swing supporting portion 4 to be in the same thickness as those of the portion having the first silicon layer in the movable body 2 and the portion having the first silicon layer in the frame 3, an influence of the shape instability of the end portions of each swing supporting portion 4 inclusive of such variations can be suppressed. In this case, when producing the micro-mirror element, the resist pattern 15 illustrated in FIG. 3C may be removed, to thereby perform the etching process.

Further, in the above-mentioned embodiment, over the entirety of the opposing side faces of the movable body 2 and the entirety of the inner surfaces of the frame 3, the lower portion having the insulating layer and the second silicon layer is protruded toward the frame 3 side or the movable body 2 side compared to the upper side portion having the first silicon layer, but the invention is not limited thereto. In the movable body 2 and the frame 3, the portion having the insulating layer and the second silicon layer may be partially protruded compared to the portion having the first silicon layer, to thereby form the end portions of each swing supporting portion 4 on an upper surface of the partially protruded portion having the insulating layer and the second silicon layer.

Figure 6:
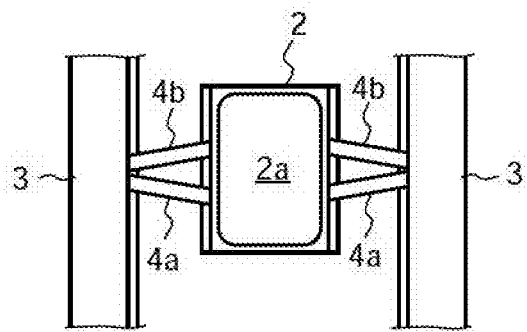
FIG. 6 is a top view illustrating an essential part of a micro-mirror element according to a modified example.

Furthermore, in the above-mentioned embodiment, each swing supporting portion 4 is formed in one rod-shaped member. However, as illustrated in an essential part top view of FIG. 6, each swing supporting portion 4 may include two rod-shaped members 4a and 4b. In this case, it is preferable to form the rod-shaped members 4a and 4b in a V-shape so that a distance therebetween is gradually widened from the frame 3 toward the movable body 2. Thus, even if the torsional resistance forces of the portions functioning as the torsion bar are set to be low, it is possible to suppress an inappropriate operation of the movable body 2, for example the rotation of the mirror surface 2a around a normal line, so that the electrode teeth 5a of each of the first comb-shaped electrodes 5 and the electrode teeth 6a of each of the second comb-shaped electrodes 6 are prevented from being in contact with each other.

Still further, in the above-mentioned embodiment, each swing supporting portion 4 is formed by performing the etching process (two-staged DRIE), that is, by engraving the material substrate. However, the present structure can also be applied to each swing supporting portion 4 formed by performing the film deposition contrary to the above. In this case, it is also possible to suppress the influence of shape instability in the end portions of each swing supporting portion 4.

Figure 7A:
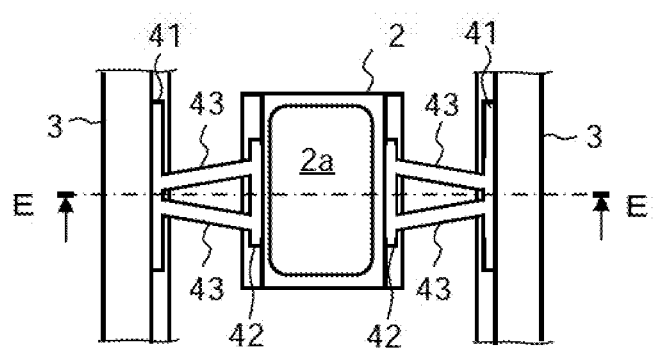
FIG. 7 is a view illustrating an essential port of a micro-mirror element according to a further modified example.
Figure 7B:
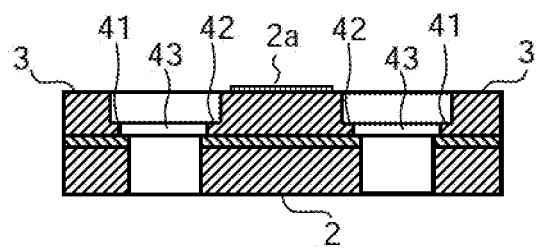

Even still further, as in FIG. 7A and FIG. 7B illustrating an essential part of each swing supporting portion 4, each swing supporting portion 4 may include: a frame side connecting portion (first connecting portion) 41; a movable body side connecting portion (second connecting portion) 42; and bridging portions 43 which connect between the frame side connecting portion 41 and the movable body side connecting portion 42. FIG. 7 illustrates an example in which each swing supporting portion 4 is formed in a V-shape (that is, two bridging portions are formed), similarly to FIG. 6.

The frame side connecting portion 41 is formed to extend along the inner surface of the frame 3 in an extending direction of the frame 3, that is, in a direction orthogonal to a thickness direction of the frame 3. Further, the movable body side connecting portion 42 is formed to extend along the side face of the movable body 2 in parallel with the frame side connecting portion 41, that is, in a direction orthogonal to a thickness direction of the movable body 2. Incidentally, "extending in the orthogonal direction" does not mean "extending strictly in the orthogonal direction", but includes "extending nearly in the orthogonal direction". Further, sizes in the extending direction (lengths) of both connecting portions may be larger than the width of the bridging portion 43, and accordingly, can be arbitrarily set. Then, the frame side connecting portion 41 and a frame 3 side end portion of the bridging portion 43 are supported from underneath by the portion having the second silicon layer in the frame 3, and the movable body side connecting portion 42 and a movable body 2 side end portion of the bridging portion 43 are supported from underneath by the portion having the second silicon layer in the movable body 2.

Thus, the shape instability in both end portions of each swing supporting portion 4 due to the mask shape or the etching can be absorbed by the frame side connecting portion 41 and the movable body side connecting portion 42. Therefore, the deviation in resonance frequency of the movable body 2 can be further effectively suppressed. Incidentally, in the case where the movable body 2 has the first silicon layer, each swing supporting portion 4 does not include the movable body side connecting portion 42, and only the frame side connecting portion 41 and the frame 3 side end portion of the bridging portion 43 are supported from underneath.

Moreover, in the above-mentioned embodiment, the micro-mirror element is produced from the material substrate (SOI substrate) having the multilayer structure having the first silicon layer, the insulating layer and the second silicon layer. However, the micro-mirror element may be produced using a material substrate having many more layers. In this case, the end portions of each swing supporting portion 4 are formed on the upper surface of the portion including the insulating layer and the second silicon layer, which protrudes toward the movable body 2 side or the frame 3 side compared to the portion having the first silicon layer in the frame 3 or in the movable body 2. Then, the end portions of each swing supporting portion 4 are supported from underneath by the portion including the second silicon layer in the frame 3 or in the movable body 2, that is, the portion having at least the second silicon layer in the frame 3 or in the movable body 2.

Various types of modifications described in the above can be appropriately combined with each other, and needless to say, a number of the micro-mirror elements 1 according to the present embodiment can be arranged to configure a micro-mirror array.

Figure 8:
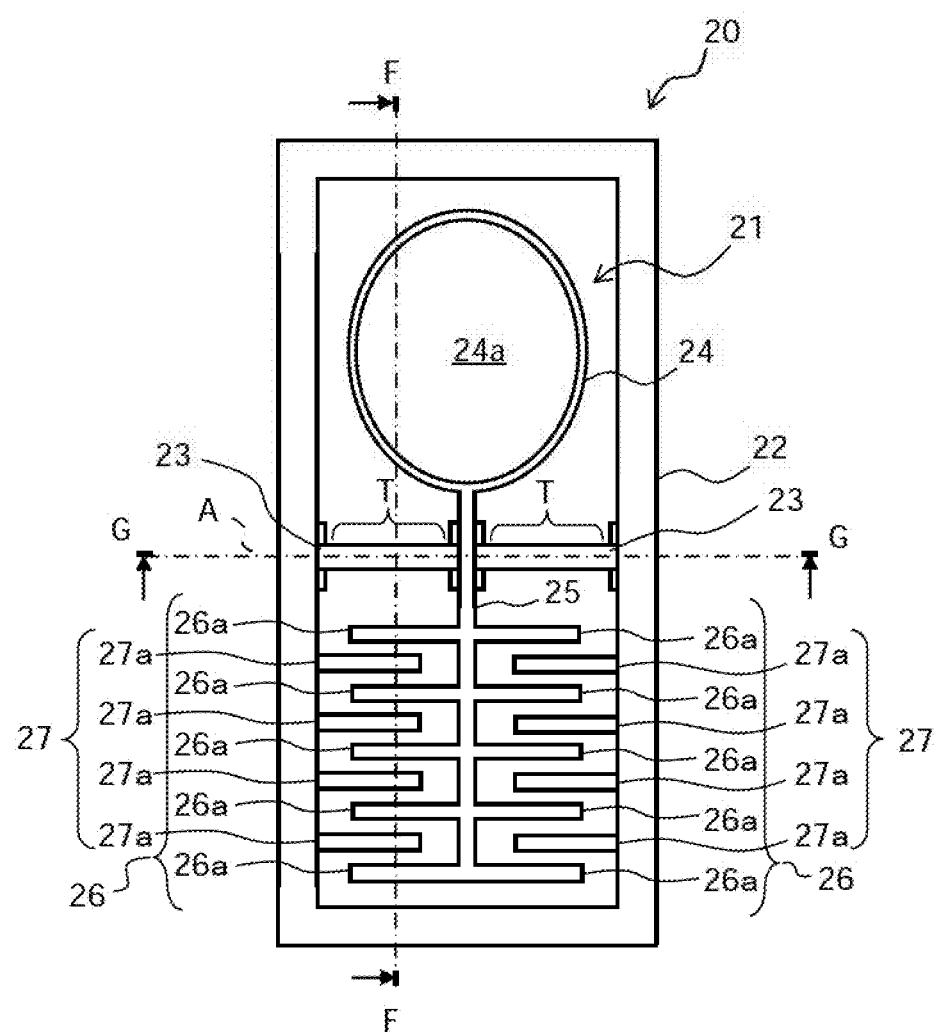
FIG. 8 is a top view illustrating a micro-mirror element according to a second embodiment of the present invention.
Figure 9:
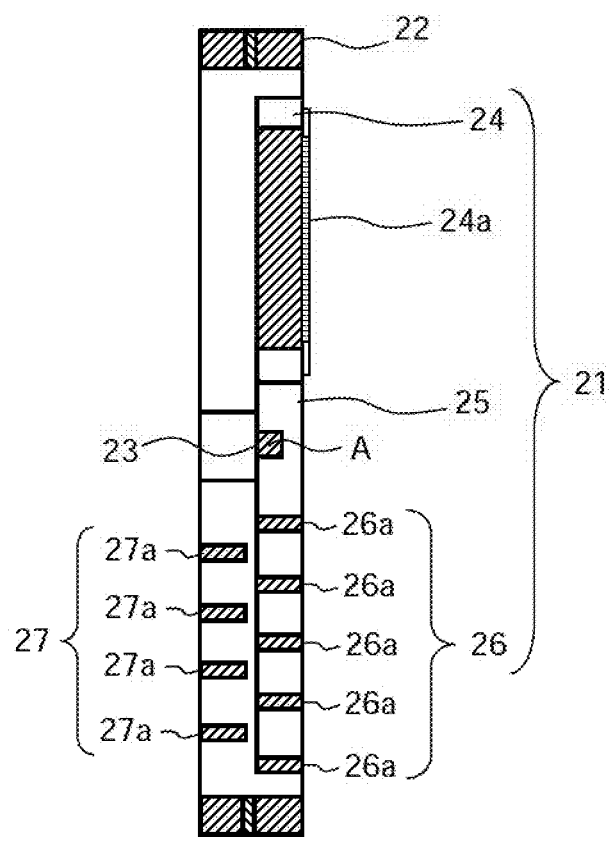
FIG. 9 is a cross sectional view taken along the line F-F of FIG. 8.
Figure 10:
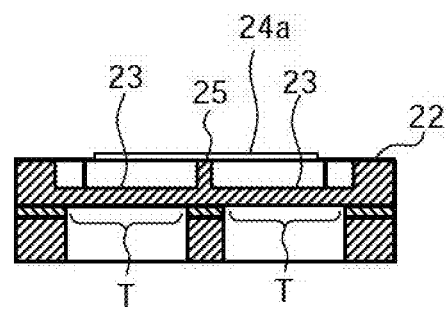
FIG. 10 is a cross sectional view taken along the line G-G of FIG. 8.

FIG. 8 to FIG. 10 illustrate a micro-mirror element as a micro-structure according to a second embodiment of the present invention. FIG. 8 is a top view of the micro-mirror element according to the second embodiment, FIG. 9 is a cross sectional view taken along the line F-F of FIG. 8, and FIG. 10 is a cross sectional view taken along the line G-G of FIG. 8.

The micro-mirror element according to the present embodiment is also produced by processing a SOI substrate (material substrate) by utilizing the bulk micro-machining technology as the MEMS technology, similarly to the micro-mirror element in the first embodiment. Incidentally, in the following description, the contents similar to those in the first embodiment will be arbitrarily omitted.

As illustrated in FIG. 8, a micro-mirror element 20 includes a movable body 21, a frame 22 and a pair of swing supporting portions 23.

The movable body 21 is disposed inside of the frame 22, and includes a mirror forming portion 24, an arm portion 25 and a first comb-shaped electrode 26. The mirror forming portion 24 is composed a first silicon layer, and a mirror surface 24a for reflecting a light is formed on a surface thereof. The arm portion 25 mainly has the first silicon layer, and is formed to extend from the mirror forming portion 24. However, at a connecting portion (to be described later) of each swing supporting portion 4 and a periphery thereof, the arm portion 25 has partially a multilayer structure having the first silicon layer, an insulating layer and a second silicon layer. The first comb-shaped electrode 26 has the first silicon layer, and includes a plurality of electrode teeth 26a. The respective electrode teeth 26a are formed to extend from the arm portion 25 in a direction crossing (herein, orthogonal to) an extending direction of the arm 25, and are spaced to each other in the extending direction of the arm 25. Incidentally, the first comb-shaped electrode 26 includes same number of electrode teeth 26a on both ends thereof with the arm portion 25 therebetween.

The frame 22 has a multilayer structure having the first silicon layer, the insulating layer and the second silicon layer, and is formed in a rectangular frame shape surrounding the movable body 21. The frame 22 includes a second comb-shaped electrode 27 corresponding to the first comb-shaped electrode 26. The second comb-shaped electrode 27 for cooperating with the first comb-shaped electrode 26 to generate an electrostatic force (electrostatic attraction), has the second silicon layer, and includes a plurality of electrode teeth 27a. As illustrated in FIG. 9, the respective electrode teeth 27a of the second comb-shaped electrode 27 are formed below the respective electrode teeth 26a of the first comb-shaped electrode 26, to extend from inner surfaces of the frame 22 opposite to each other. Each electrode tooth 27a of the second comb-shaped electrode 27 extends in parallel with each electrode teeth 26a of the first comb-shaped electrode 26, and is positioned between two adjacent electrode teeth 26a of the first comb-shaped electrode 26 in the extending direction of the arm portion 25 (or as viewed from above).

The pair of swing supporting portions 23 is disposed with the movable body 21 (and furthermore, the arm portion 25) therebetween, to define a swing center axis A of swinging operation of the movable body 21. As illustrated in FIG. 10, each swing supporting portion 23 connects a portion having the first silicon layer in the arm portion 25 and a portion having the first silicon layer in the frame 22, and is formed to be thinner than the portion having the first silicon layer in the arm portion 25 and the portion having the first silicon layer in the frame 22.

A movable body 21 (arm portion 25) side end portion of each swing supporting portion 23 is supported, via the insulating layer, from underneath by the portion having the second silicon layer in the arm portion 25. Namely, the movable body 21 (the arm portion 25) side end portion of each swing supporting portion 23 is formed on an upper surface of a portion having the insulating layer and the second silicon layer, which protrudes toward the frame 22 side compared to the portion having the first silicon layer in the arm portion 25.

A frame 22 side end portion of each swing supporting portion 23 is supported, via the insulating layer, from underneath by the portion having the second silicon layer in the frame 22. Namely, the frame 22 side end portion of each swing supporting portion 23 is formed on an upper surface of a portion having the insulating layer and the second silicon layer, which protrudes toward the arm portion 25 side compared to the portion having the first silicon layer in the frame 22.

Namely, each swing supporting portion 23 having the first silicon layer has a structure in which both end portions thereof are supported from underneath by the portion having the second silicon layer in the arm portion 25 and the portion having the second silicon layer in the frame 22. Thus, in each swing supporting portion 23, a region (portion) which is not supported from underneath by the portion having the second silicon layer in the arm portion 25 and the portion having the second silicon layer in the frame 22, that is, T-portion in FIG. 8, substantially functions as "a torsion bar".

When a predetermined voltage is applied between the first comb-shaped electrode 26 and the second comb-shaped electrode 27, the electrostatic attraction is generated between the first comb-shaped electrode 26 and the second comb-shaped electrode 27, so that the first comb-shaped electrode 26 is attracted to the second comb-shaped electrode 27. As a result, the movable body 21 swings around the swing center axis A to be rotationally displaced to an angle at which the generated electrostatic attraction is commensurate with the sum of torsional resistance forces of the respective swing supporting portions 23 (the T-portions functioning as the torsion bar). By regulating the voltage to be applied between the first comb-shaped electrode 26 and the second comb-shaped electrode 27, the rotational displacement angle of the movable body 21 can be regulated, and thus, an angle of the mirror surface 24a is controlled.

According to the micro-mirror element 20 in the present embodiment, in addition to the effects in the micro-mirror element 1 according to the first embodiment, the following effects are further obtained.

Namely, in the micro-mirror element 20 according to the present embodiment, the first comb-shape electrode 26 and the second comb-shaped electrode 27, serving as a driving mechanism for swinging the movable body 21, are disposed on positions spaced from the mirror forming portion 24 in a direction orthogonal to the swing center axis A. Therefore, even if a size of the micro-mirror element 20 in a direction of the swing center axis A is made to be smaller, a driving force for the swinging operation of the movable body 21 can be sufficiently ensured, and accordingly, the micro-mirror element 20 can be miniaturized, for example. Further, if a micro-mirror array is configured by arranging a number of the micro-mirror elements 20 along the swing center axis A, it is possible to make a mirror pitch to be smaller to thereby miniaturize the entire micro-mirror array.

Figure 11:
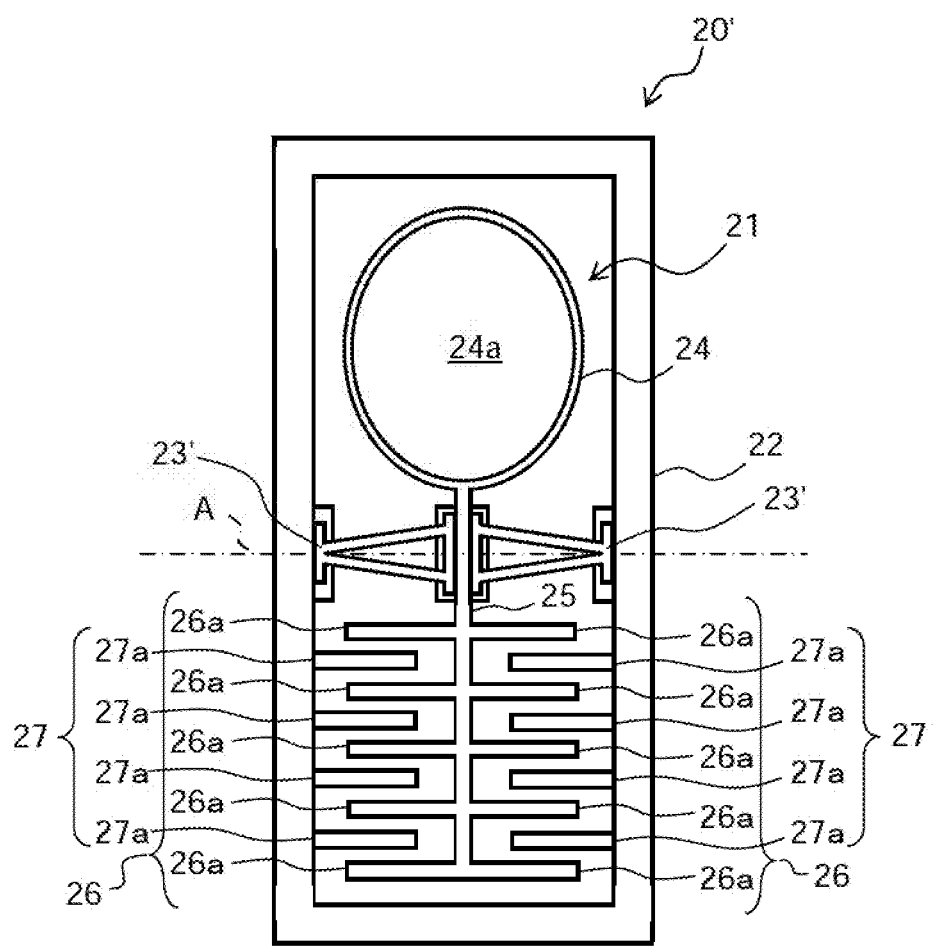
FIG. 11 is a top view illustrating a modified example of the micro-mirror element according to the second embodiment.

Incidentally, the above described various types of modifications for the micro-mirror element 1 according to the first embodiment can be applied to the micro-mirror element 20 according to the present embodiment. As one example, FIG. 11 illustrates a micro-mirror element 20' in which each swing supporting portion in the second embodiment is formed in a V-shape, similarly to FIG. 7. Herein, each swing supporting portion 23' includes a frame side connecting portion, a movable body side connecting portion and a bridging portion.

Figure 12:
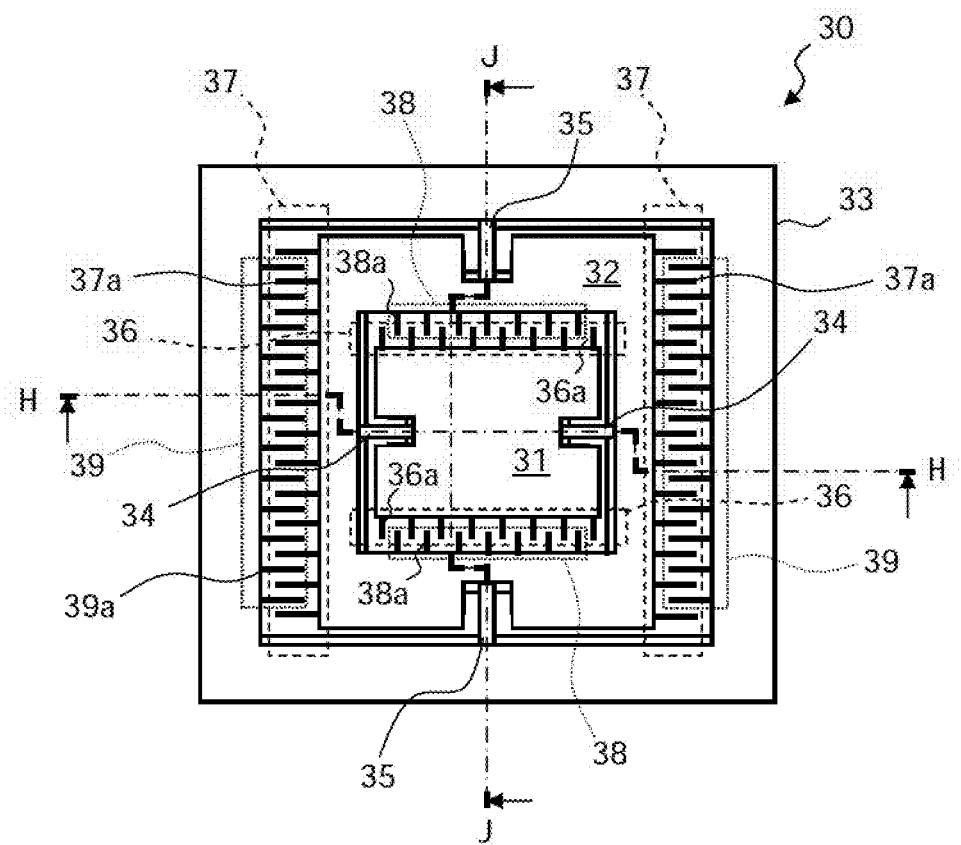
FIG. 12 is a top view illustrating an angular speed sensor according to a third embodiment of the present invention.
Figure 13:
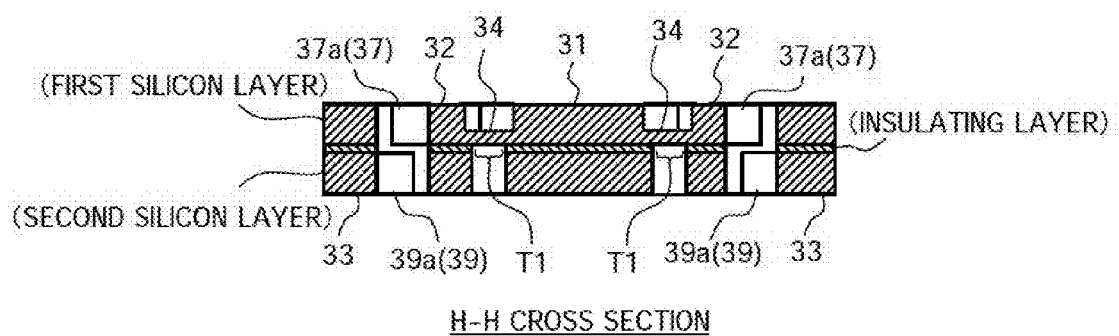
FIG. 13 is a cross sectional view taken along the line H-H of FIG. 12.
Figure 14:
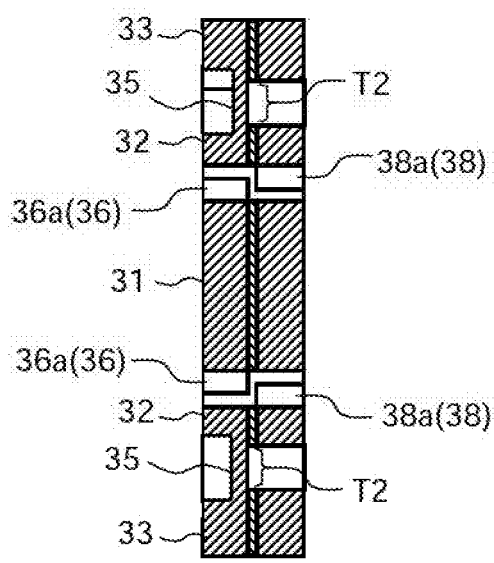
FIG. 14 is a cross sectional view taken along the line J-J of FIG. 12.

FIG. 12 to FIG. 14 illustrate an angular velocity sensor as a micro-structure according to a third embodiment of the present invention. FIG. 12 is a top view of the angular speed sensor according to the third embodiment, FIG. 13 is a cross sectional view taken along the line H-H of FIG. 12, and FIG. 14 is a cross sectional view taken along the line J-J of FIG. 12.

The angular velocity sensor according to the present embodiment is also produced by processing a SOI substrate (material substrate) similar to that in the first embodiment by utilizing the bulk micro-machining technology as the MEMS technology. Incidentally, in the following description, the contents similar to those in the first embodiment will be arbitrarily omitted.

As illustrated in FIG. 12, an angular velocity sensor 30 according to the present embodiment includes a first movable body 31, a second movable body 32, a frame 33, a pair of first swing supporting portions 34 and a pair of second swing supporting portions 35. Incidentally, for the first swing supporting portions 34 and the second swing supporting portions 35, axes thereof are orthogonal to each other.

The first movable body 31 has a multilayer structure having a first silicon layer, an insulating layer and a second silicon layer. The first movable body 31 is formed in a H-shape having concave portions on two side faces thereof opposite to each other in a horizontal direction in FIG. 12, to be disposed inside of the second movable body 32. On two side faces of the first movable body 31, on which the concave portions are not disposed, herein, on two side faces opposite to each other in a vertical direction in FIG. 12, first comb-shaped electrodes 36 are formed to extend. Each of the first comb-shaped electrodes 36 has the first silicon layer, and includes a plurality of electrode teeth 36a spaced to each other.

The second movable body 32 has a multilayer structure having the first silicon layer, the insulating layer and the second silicon layer. The second movable body 32 surrounds the first movable body 31 with a predetermined gap therebetween, and is formed to have concave portions on two outer side faces thereof opposite to each other, herein, two outer side faces thereof opposite to each other in the vertical direction in FIG. 12, to be disposed inside of the frame 33.

On outer side faces of the second movable body 32, on which the concave portions are not disposed, herein, two outer side faces opposite to each other in the horizontal direction in FIG. 12, second comb-shaped electrodes 37 are formed to extend. Each of the second comb-shaped electrodes 37 has the first silicon layer, and includes a plurality of electrode teeth 37a spaced to each other. Further, on two inner side faces of the second movable body 32 opposite to each other, herein, two inner side faces opposite to each other in the horizontal direction in FIG. 12, third comb-shaped electrodes 38 which correspond to the first comb-shaped electrodes 36 formed in the first movable body 31, are formed to extend. Each of the third comb-shaped electrodes 38 has the second silicon layer, and includes a plurality of electrode teeth 38a spaced to each other. Then, the first movable body 31 and the second movable body 32 are electrostatic-coupled to each other by the first comb-shaped electrodes 36 and the third comb-shaped electrodes 38. Hereunder, an electrode pair of the first comb-shaped electrodes 36 and the comb-shaped electrodes 38 is referred to as "first electrostatic-coupling portion".

The frame 33 has a multilayer structure having the first silicon layer, the insulating layer and the second silicon layer, and is formed in a rectangular frame shape surrounding the second movable body 32 (and the first movable body 31) with a predetermined gap therebetween. On two inner side faces of the frame 33 opposite to each other, herein, two inner side faces opposite to each other in the horizontal direction in FIG. 12, fourth comb-shaped electrodes 39 which correspond to the second comb-shaped electrodes 37 of the second movable body 32, are formed to extend. Each of the fourth comb-shaped electrodes 39 has the second silicon layer, and includes a plurality of electrode teeth 39a spaced to each other. Then, the second movable body 32 and the frame 33 are electrostatic-coupled by the second comb-shaped electrodes 37 and the fourth comb-shaped electrodes 39. Hereunder, an electrode pair of the second comb-shaped electrodes 37 and the fourth comb-shaped electrodes 39 is referred to as "second electrostatic-coupling portion".

The first swing supporting portions 34 connect the concave portions of the first movable body 31 and the inner side faces which are opposite to the concave portions, of the second movable body 32, to support the first movable body 31 to be capable of swinging. As illustrated in FIG. 13, each of the first swing supporting portions 34 has the first silicon layer, and connects a portion having the first silicon layer in the first movable body 31 and a portion having the first silicon layer in the second movable body 32. Further, each of the first swing supporting portions 34 is formed to be thinner than the portion having the first silicon layer in the first movable body 31 and the portion having the first silicon layer in the second movable body 32.

A first movable body 31 side end portion of each of the first swing supporting portions 34 is supported, via the insulating layer, from underneath by a portion having the second silicon layer in the first movable body 31. Namely, the first movable body 31 side end portion of each of the first swing supporting portions 34 is formed on an upper surface of a portion having the insulating layer and the second silicon layer, which protrudes toward the second movable body 32 side compared to the portion having the first silicon layer in the first movable body 31.

A second movable body 32 side end portion of each of the first swing supporting portions 34 is supported, via the insulating layer, from underneath by a portion having the second silicon layer in the second movable body 32. Namely, the second movable body 32 side end portion of each of the first swing supporting portions 34 is formed on an upper surface of a portion having the insulating layer and the second silicon layer, which protrudes toward the first movable body 31 side compared to the portion having the first silicon layer in the second movable body 32.

Thus, in each of the first swing supporting portions 34, a region (portion) which is not supported from underneath by the portion having the second silicon layer in the first movable body 31 and the portion having the second silicon layer in the second movable body 32, that is, T1 portion in FIG. 13, substantially functions as a "torsion bar".

The second swing supporting portions 35 connect the concave portions of the second movable body 32 and the inner side faces which are opposite to the concave portions, of the frame 33, to support the second movable body 32 to be capable of swinging. As illustrated in FIG. 14, each of the second swing supporting portions 35 has the first silicon layer, and connects the portion having the first silicon layer in the second movable body 32 and a portion having the first silicon layer in the frame 33. Further, each of the second swing supporting portions 35 is formed to be thinner than the portion having the first silicon layer in the second movable body 32 and the portion having the first silicon layer in the frame 33.

Here, the thickness of each of the first swing supporting portions 34 may be same as or different from the thickness of each of the second swing supporting portions 35.

A second movable body 32 side end portion of each of the second swing supporting portions 35 is supported, via the insulating layer, from underneath by the portion having the second silicon layer in the second movable body 32. Namely, the second movable body 32 side end portion of each of the second swing supporting portions 35 is formed on an upper surface of a portion having the insulating layer and the second silicon layer, which protrudes toward the frame 33 side compared to the portion having the first silicon layer in the second movable body 32.

A frame 33 side end portion of each of the second swing supporting portions 35 is supported, via the insulating layer, from underneath by a portion having the second silicon layer in the frame 33. Namely, the frame 33 side end portion of each of the second swing supporting portions 35 is formed on an upper surface of a portion having the insulating layer and the second silicon layer, which protrudes toward the second movable body 32 side compared to the portion having the first silicon layer in the frame 33.

Thus, in each of the second swing supporting portions 35, a regions (portion) which is not supported from underneath by the portion having the second silicon layer in the second movable body 32 and the portion having the second silicon layer in the frame 33, that is, T2 portion in FIG. 14, substantially functions as a "torsion bar".

Figure 15:
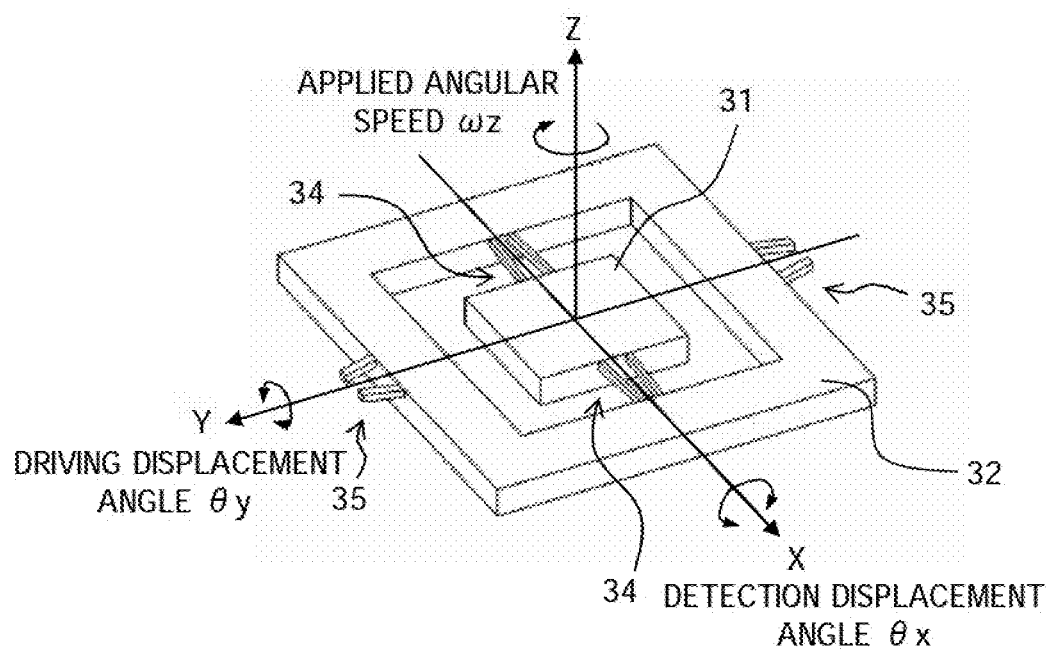
FIG. 15 is a view explaining an operation principle of the angular speed sensor according to the third embodiment.

FIG. 15 is a view for explaining an operation principle of the angular speed sensor 30 according to the present embodiment. Herein, FIG. 15 illustrates only the first movable body 31, the second movable body 32, the first swing supporting portions 34 and the second swing supporting portions 35. Further, FIG. 15 illustrates an example in which each of the first swing supporting portions 34 and the second swing supporting portions 35 is formed in the V-shape by two rod members (refer to FIG. 6 and FIG. 7). Here, a swing center axis in the swinging operation of the first movable body 31, which is defined by the first swing supporting portions 34, is an X-axis, a swing center axis in the swinging operation of the second movable body 32, which is defined by the second swing supporting portions 35, is a Y-axis, and a normal direction of the upper surface of the first movable body 31 is a Z-axis.

Firstly, a voltage is applied alternately to the two second electrostatic-coupling portions (the second comb-shaped electrodes 37 and the fourth comb-shaped electrodes 39), to thereby swing (vibrate) the first movable body 31 and the second movable body 32 around the Y-axis. A rotational displacement angle (driving displacement angle) at the time is $\theta y$. In this state, the rotation of angular velocity (applied angular velocity) $\omega z$ is exerted around the Z-axis, a Coriolis force is generated in a direction orthogonal to the Y-axis, so that the first movable body 31 and the second movable body 32 are to swing around the X-axis orthogonal to the Y-axis. However, since the second movable body 32 cannot swing, only the first movable body 31 swings around the X-axis. When the first movable body 31 swings, electrostatic capacitances of the two first electrostatic-coupling portions (the first comb-shaped electrodes 36 and the third comb-shaped electrodes 38) are alternately changed. By differentially detecting the electrostatic capacitances, a rotational displacement angle (detection displacement angle) $\theta x$ of the first movable body 31 is detected. The detected rotational displacement angle $\theta x$ has a value proportional to the angular velocity $\omega z$, and thus, the angular velocity $\omega z$ can be detected based on the detected rotational displacement angle $\theta x$.

According to the angular speed sensor 30 in the present embodiment, similarly to the micro-mirror element according to the first or second embodiment, resonance frequencies and the like of the first and second movable bodies 31 and 32 are not practically affected by the thicknesses or shapes of the first and second swing supporting portions 34 and 35. As a result, deviation in the torsional rigidity or the like of the torsion bar due to the shape instability of the end portions of the first and second swing supporting portions 34 and 35 can be suppressed while enabling the first and second swing supporting portions 34 and 35 to be thinner, to achieve the multiple design specifications of the torsion bar, so that the angular velocity can be detected in stable with high precision.

In the above description, the micro-mirror element and the angular velocity sensor are described as the micro-mirror element. However, the present invention is not limited to the above, and can be applied to a micro-structure having the same configuration, for example, an acceleration sensor, another swing element, or the like. Namely, the present invention can be applied to a micro-structure which has a configuration of supporting a movable body to be capable of swinging.

In the micro-structure according to each embodiment described above, each swing supporting portion which supports the movable body to be capable of swinging, is having the first layer, and the end portions of each swing supporting portions are supported from underneath by the portion having the second layer on the lower side of the first layer in the frame and the portion having the second layer in the movable body. Therefore, the portion other than the end portions of each swing supporting portions, that is, the portion formed in relatively stable, functions as the torsion bar. As a result, it is possible to suppress the shape instability of the end portions of the torsion bar and the characteristic variations of the micro-structure accompanied with the shape instability.

Next, there will be described an optical switch to which is applied the micro-mirror element as the micro-structure according to each embodiment of the present invention.

Figure 16:
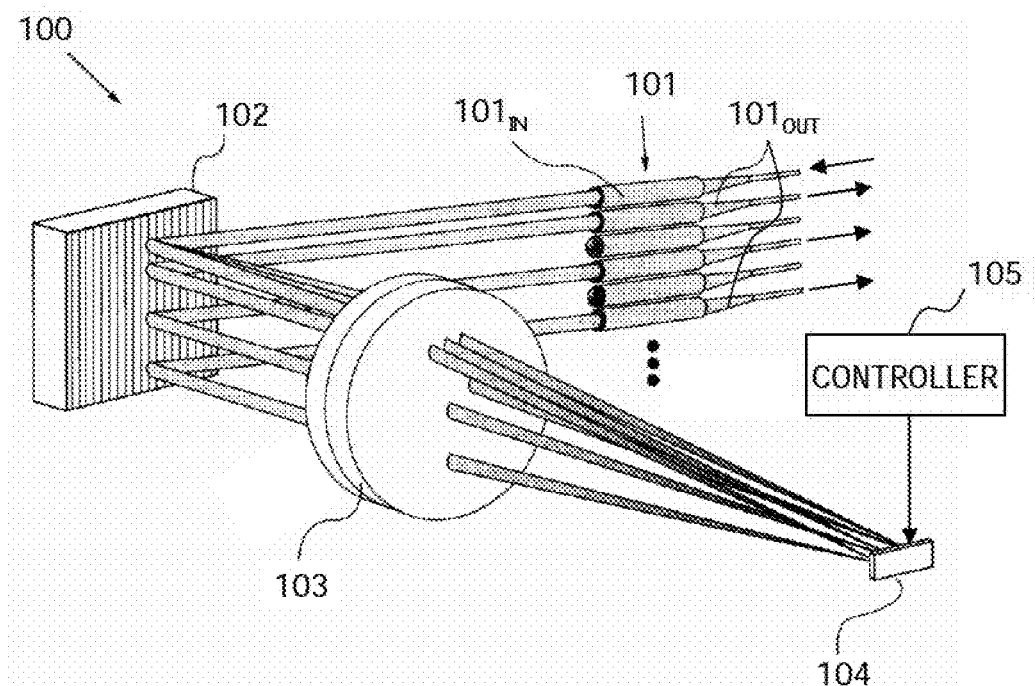
FIG. 16 is a view illustrating one example of optical switch to which the micro-mirror element according to each embodiment of the present invention is applied.

FIG. 16 illustrates one example of wavelength selective switch (WSS) as the optical switch.

As illustrated in FIG. 16, a wavelength selective switch 100 includes a fiber collimator array 101, a diffraction grating 102, a condenser lens 103, a micro-mirror array 104 and a controller 105 that controls an angle of each mirror in the micro-mirror array 104.

The fiber collimator array 101 as an optical input/output part, in which (N+1) fiber collimators are arranged in one direction, includes one input port $101_{IN}$ and a plurality of output ports $101_{OUT}(\#1)$ to $101_{OUT}(\#N)$.

The diffraction grating 102 as an optical separator separates a wavelength division multiplexed light input from the input port $101_{IN}$ to different angular directions according to wavelengths.

The condenser lens 103 as an optical condenser condenses, on different positions, lights ch1 to chN (to be referred to as "wavelength channels ch1 to chN, hereunder) of the respective wavelengths, which are separated by the diffraction grating 102.

The micro-mirror array 104 includes a plurality of micro-mirror elements (#1 to #N) disposed on condensing positions of the respective wavelength channels ch1 to chN. The respective wavelength channels reached the micro-mirror array 104 are reflected by the micro-mirror elements corresponding thereto, to be turned back to predetermined directions.

The controller 105 controls the respective micro-mirror elements at angles corresponding to positions of the output ports set as output targets of the respective wavelength channels. As a result, the wavelength channels turned back by the micro-mirror elements pass through the condenser lens 103 and the diffraction grating 102 in this sequence, to be led to desired output ports.

Here, as each micro-mirror element, for example, the micro-mirror element according to the first embodiment (refer to FIG. 1 to FIG. 3) or the second embodiment (refer to FIG. 8 to FIG. 10), or the micro-mirror element having the structure corresponding to each modified example of the first or second embodiment, is used. Namely, the controller 105 applies a predetermined drive voltage between the comb-shaped electrodes of each micro-mirror element, to control the angle of the mirror surface disposed on the surface of the movable body. According to such a configuration, the portion other than the end portions of each swing supporting portion, that is, the portion formed in relatively stable, functions as the torsion bar. As a result, since the shape instability of the end portions of the torsion bar and the characteristic variations of each micro-mirror element accompanied with the shape instability are suppressed, the angle of each micro-mirror element (mirror surface) can be controlled at a desired angle with high precision by the controller 105. Accordingly, it is possible to achieve the wavelength selective switch which stably operates with high precision.

Incidentally, herein, "the wavelength selective switch" which changes-over transmission routes of the wavelength division multiplexed light (signals) for each wavelength is described as the optical switch. However, the optical switch is not limited thereto. Needless to say, there may be used an optical switch which reflects the light input to the input port by the micro-mirror element, to output it from the desired output port. In this case, the diffraction grating 102 and the condenser lens 103 are not necessary, and the configuration may be such that the controller controls the angle of the mirror surface of each micro-mirror element, to change-over the transmission routes of the light between the input port and the output ports.

In the optical switch according to the above-mentioned embodiment, the micro-mirror element according to the first or second embodiment (inclusive of the modified examples) is adopted as each micro-mirror element which configures the micro-mirror array. Thus, in each micro-mirror element, since the shape instability of the end portions of the torsion bar and the characteristic variations of each micro-mirror element accompanied with the shape instability are suppressed, the angle of each micro-mirror element (mirror surface) can be controlled at a desired angle with high precision. As a result, it is possible to achieve the optical switch which stably operates with high precision.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A micro-structure comprising:
a frame including a portion having a first layer and a portion having a second layer on the lower side of the first layer;
a movable body including a portion having the first layer and a portion having the second layer; and
at least one swing supporting portion which has the first layer, and connects the portion having the first layer in the frame and the portion having the first layer in the movable body, to support the movable body to be capable of swinging,
wherein a frame side end portion of the swing supporting portion is supported from underneath by at least the portion having the second layer in the frame, and
a movable body side end portion of the swing supporting portion is supported from underneath by at least the portion having the second layer in the movable body.

2. A micro-structure according to claim 1,
wherein the first layer and the second layer are conductive layers, and an insulating layer is disposed between the first layer and the second layer;
the frame side end portion of the swing supporting portion is supported, via the insulating layer, from underneath by the portion having the second layer in the frame; and
the movable body side end portion of the swing supporting portion is supported, via the insulating layer, from underneath by the portion having the second layer in the movable body.

3. A micro-structure according to claim 1,
wherein the first layer and the second layer are conductive layers, and an insulating layer is disposed between the first layer and the second layer;
the frame side end portion of the swing supporting portion is formed on an upper surface of a portion including the insulating layer and the second layer, which protrudes toward the movable body side compared to the portion having the first layer in the frame; and
the movable body side end portion of the swing supporting portion is formed on an upper surface of a portion including the insulating layer and the second layer, which protrudes toward the frame side compared to the portion having the first layer in the movable body.

4. A micro-structure according to claim 1,
wherein the swing supporting portion includes;
a first connecting portion which is connected to the portion having the first layer in the frame, and extends along a side face of the frame in a direction orthogonal to a thickness direction of the frame;
a second connecting portion which is connected to the portion having the first layer in the movable body, and extends along a side face of the movable body in a direction orthogonal to a thickness direction of the movable body; and
a bridging portion which connects between the first connecting portion and the second connecting portion,
the first connecting portion and a first connecting portion side end portion of the bridging portion are supported from underneath by at least the portion having the second layer in the frame, and
the second connecting portion and a second connecting portion side end portion of the bridging portion are supported from underneath by at least the portion having the second layer in the movable body.

5. A micro-structure according to claim 4,
wherein the first layer and the second layer are conductive layers, and an insulating layer is disposed between the first layer and the second layer,
the first connecting portion and the first connecting portion side end portion of the bridging portion are formed on an upper surface of a portion including the insulating layer and the second layer, which protrudes toward the movable body side compared to the portion having the first layer in the frame, and
the second connecting portion and the second connecting portion side end portion of the bridging portion are formed on an upper surface of a portion including the insulating layer and the second layer, which protrudes toward the frame side compared to the portion having the first layer in the movable body.

6. A micro-structure according to claim 1,
wherein the swing supporting portion is formed to be thinner than the portion having the first layer in the frame and the portion having the first layer in the movable body.

7. A micro-structure according to claim 1,
wherein the swing supporting portion is formed in a V-shape in which a space between two rod members extends to be gradually widened from the frame toward the movable body.

8. A micro-structure according to claim 1, further comprising:
first electrodes disposed to the movable body; and
second electrodes disposed to the frame,
wherein the movable body swings by utilizing an electrostatic force generated by applying a voltage between each of the first electrodes and each of the second electrodes.

9. A micro-structure according to claim 8,
wherein the first electrodes and the second electrodes are comb-shaped electrodes.

10. An optical switch for reflecting a light input to an input port by a micro-mirror element of which an angle of a mirror surface is controllable, to output reflected light from a desired output port,
wherein the micro-mirror element comprises:
a frame including a portion having a first layer and a portion having a second layer on the lower side of the first layer;
a movable body including a portion having the first layer and a portion having the second layer, on which the mirror surface is formed; and
at least one swing supporting portion has the first layer, and connects the portion having the first layer in the frame and the portion having the first layer in the movable body, to support the movable body to be capable of swinging,
a frame side end portion of the swing supporting portion is supported from underneath by at least the portion having the second layer in the frame, and
a movable body side end portion of the swing supporting portion is supported from underneath by at least the portion having the second layer in the movable body.

11. An optical switch according to claim 10,
wherein the swing supporting portion is formed to be thinner than the portion having the first layer in the frame and the portion having the first layer in the movable body.

12. An optical switch according to claim 10, further comprising:
an optical input/output part including at least one input port and a plurality of output ports;
an optical separator which separates a wavelength division multiplexed light input to the input port according to wavelengths; and
an optical condenser which condenses, on different positions, lights of respective wavelengths separated by the optical separator,
wherein the micro-mirror elements are arranged on condensing positions of the lights of the respective wavelengths, and the lights of the respective wavelengths reflected by the micro-mirror elements are output from different output ports in the input/output portion.

* * * * *